United States Patent
Waight et al.

(10) Patent No.: US 7,095,454 B2
(45) Date of Patent: Aug. 22, 2006

(54) BROADBAND SINGLE CONVERSION TUNER INTEGRATED CIRCUITS

(75) Inventors: Matthew Glenn Waight, Pipersville, PA (US); Joel David Birkeland, North Plains, OR (US); Frank Paul Prestrelski, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 551 days.

(21) Appl. No.: 10/632,018

(22) Filed: Jul. 30, 2003

(65) Prior Publication Data

US 2005/0024544 A1 Feb. 3, 2005

(51) Int. Cl.
*H04N 5/50* (2006.01)
(52) U.S. Cl. .................. 348/731; 348/733; 455/190.1; 455/191.1
(58) Field of Classification Search ........ 348/731–733, 348/725; 455/179.1, 182.1, 182.3, 183.2, 455/190.1, 191.3, 192.1, 189.1, 191.1, 209; 725/68, 131, 151; H04N 5/50
See application file for complete search history.

(56) References Cited

U.S. PATENT DOCUMENTS

| | | | | |
|---|---|---|---|---|
| 4,234,965 A | * | 11/1980 | Bickley et al. .......... | 455/191.1 |
| 4,723,306 A | * | 2/1988 | Fuenfgelder et al. ....... | 455/103 |
| 5,930,696 A | | 7/1999 | Tzuang et al. | |
| 6,031,878 A | | 2/2000 | Tomasz et al. | |
| 6,285,865 B1 | | 9/2001 | Vorenkamp et al. | |
| 6,356,736 B1 | | 3/2002 | Tomasz et al. | |
| 6,842,198 B1 | * | 1/2005 | Suzuki et al. ................ | 348/731 |

FOREIGN PATENT DOCUMENTS

EP 1 282 227 A2 2/2003

OTHER PUBLICATIONS

Comtech Technology Co., Ltd., DVBC-29708 Specification, Feb. 7, 2002.

* cited by examiner

*Primary Examiner*—Sherrie Hsia
(74) *Attorney, Agent, or Firm*—Blakely Sokoloff Taylor & Zafman LLP (57) ABSTRACT

A tunable receiver is disclosed including a plurality of select filters to perform an initial band selection, a variable-gain low noise amplifier (LNA) whose gain is controlled to prevent its output power level to exceed a pre-determined power threshold, a plurality of digitally-tunable tracking filters to pass signals within a selected channel and to reject signals in a corresponding image band, a second LNA to further amplify the received RF signal and to generate differential signal outputs, a down converting stage which converts the received RF signal to an IF signal while rejecting signals in the image band, an IF trap to further reject undesired signals present at the output of the down converting stage, an IF amplifier to amplify the IF signal to compensate for losses, an IF filter to provide channel select and reject undesirable signals, and a variable-gain IF amplifier to amplify the IF signal and maintain its power level within specification.

47 Claims, 12 Drawing Sheets

| F (MHz) | CP | CS |
|---|---|---|
| 570 | 27 | 63 |
| 580 | 26 | 59 |
| 590 | 25 | 54 |
| 600 | 24 | 50 |
| 610 | 23 | 46 |
| 620 | 23 | 42 |
| 630 | 22 | 39 |
| 640 | 21 | 35 |
| 650 | 20 | 32 |
| 660 | 19 | 29 |
| 670 | 18 | 26 |
| 680 | 17 | 23 |
| 690 | 16 | 20 |
| 700 | 15 | 18 |
| 710 | 14 | 16 |
| 720 | 14 | 13 |
| 730 | 13 | 11 |
| 740 | 12 | 10 |
| 750 | 11 | 8 |
| 760 | 10 | 6 |
| 770 | 9 | 5 |
| 780 | 8 | 4 |
| 790 | 7 | 3 |
| 800 | 6 | 2 |
| 810 | 5 | 1 |
| 820 | 4 | 1 |

A) Direct conversion to baseband

FIG. 13
B) Direct conversion with digital outputs

BROADBAND SINGLE CONVERSION TUNER INTEGRATED CIRCUITS

FIELD OF THE INVENTION

This invention relates generally to radio frequency (RF) receivers, and in particular, to integrated, tunable television receivers comprising a single down converting stage and several stages for substantially rejecting the image, harmonics, and other unwanted signals.

BACKGROUND OF THE INVENTION

Tunable receivers used in cable television set-top boxes and in other applications receive broadband signals having many channels. It is a function of such a tunable receiver to produce the signals in a desired channel and reject the signals in the remaining channels. In rejecting the signals in the undesired channels, the tunable receiver should substantially remove all signals associated with the undesired channels so that the receiver outputs substantially the signals in the desired channel. These unwanted signals include image, harmonics, spurious, and other undesired signals.

Both single conversion and double conversion receivers are known in the prior art. In a single conversion receiver, the RF signal is directly down converted to the desired frequency range, either to an intermediate frequency (IF) or sometimes to baseband. In a double conversion receiver, two frequency conversions are used. Usually the selected channel is up shifted in frequency to a fixed frequency, and then down shifted from that frequency to a fixed IF frequency. In either case, various circuits with differing degrees of integration are known for the purpose.

DETAILED DESCRIPTION OF THE INVENTION

I. The Tunable Receiver Design

Figure 1:
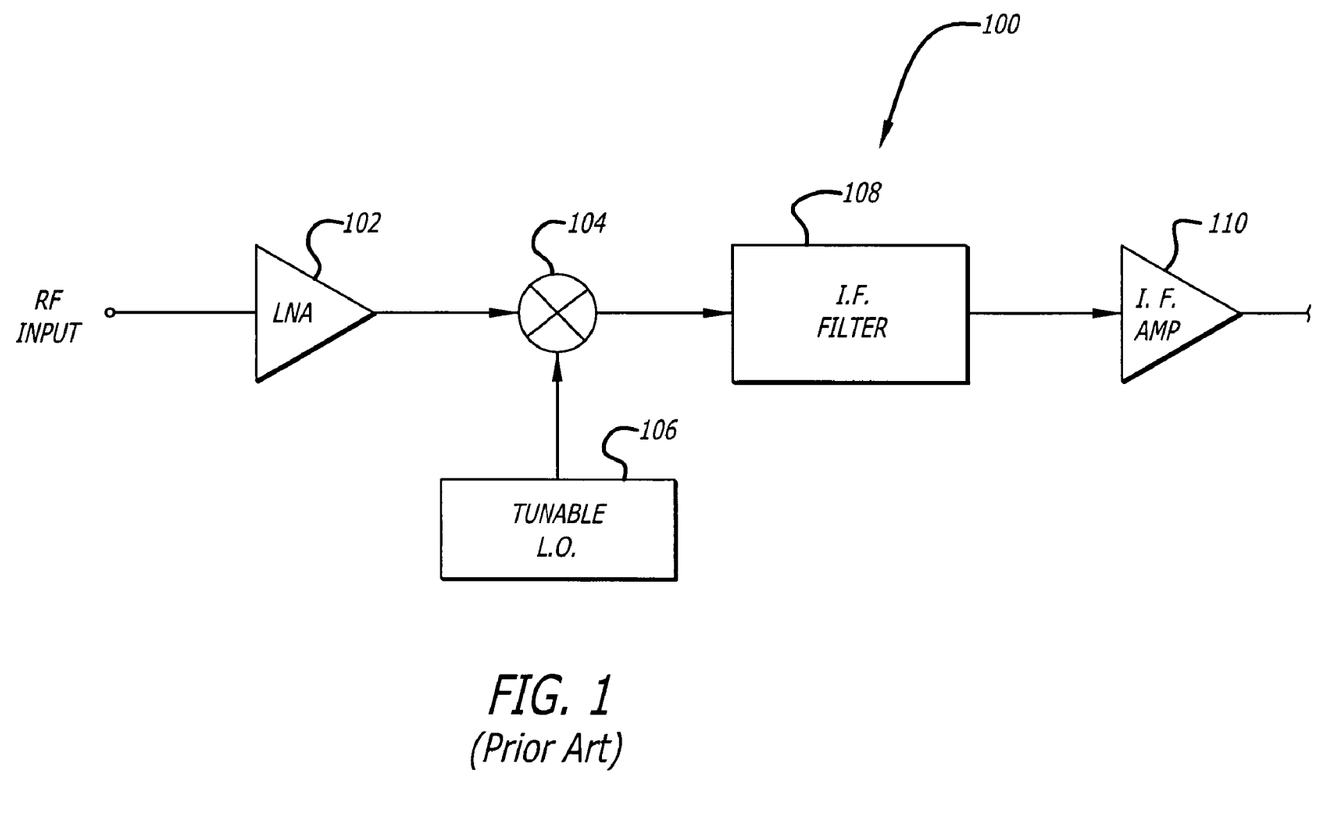
FIG. 1 illustrates a block diagram of an exemplary prior art tunable receiver.
Figure 2:
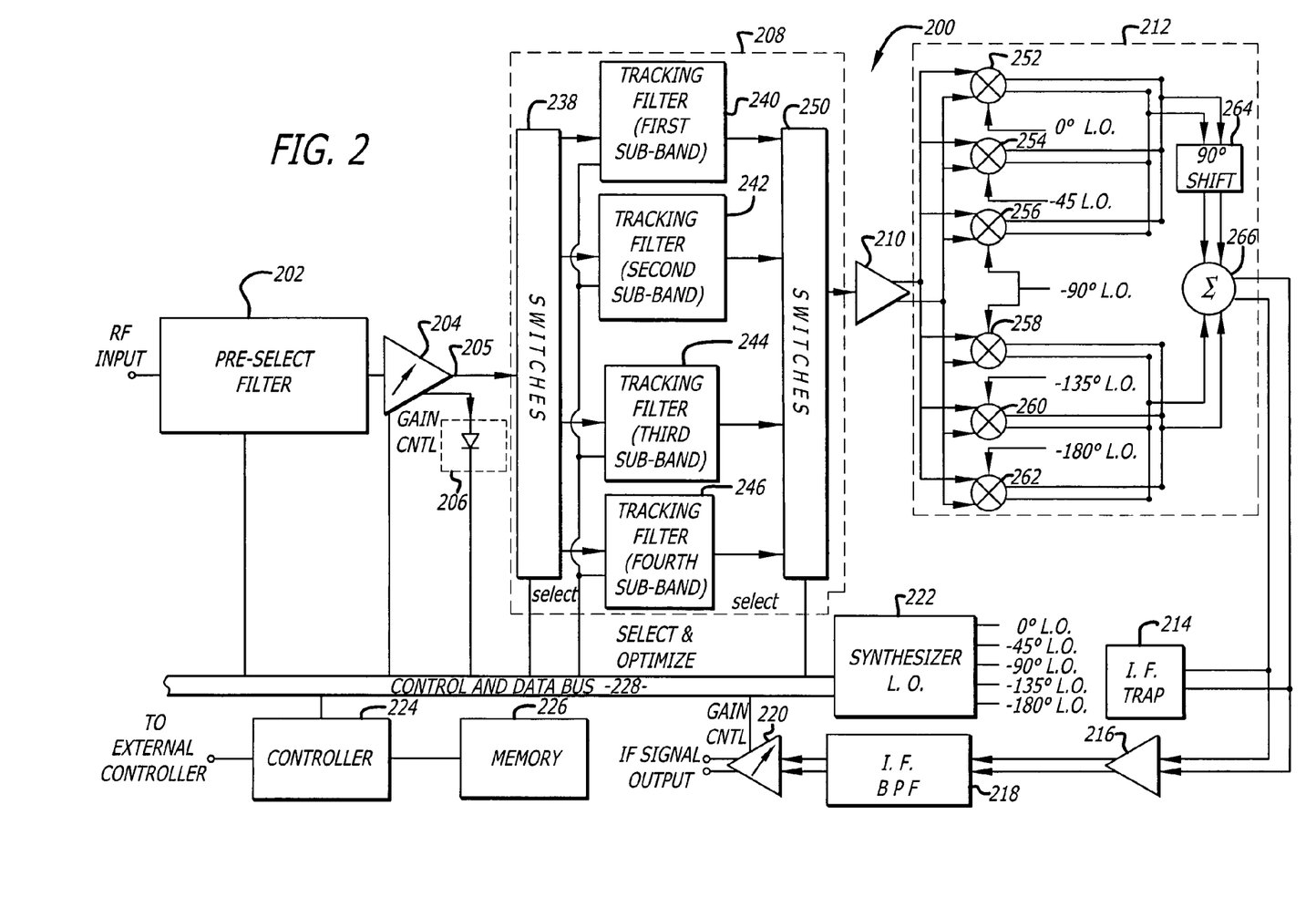
FIG. 2 illustrates a block diagram of an exemplary tunable receiver in accordance with an embodiment of the invention.

FIG. 2 is a block diagram of an exemplary tunable receiver 200 in accordance with an embodiment of the invention. The tunable receiver 200 comprises a preselect filter 202, a first low noise amplifier (LNA) 204 having a controllable gain and an associated output power monitor device 206, a bank of selectable and digitally-tunable tracking filters 208, a second LNA 210, a harmonic and image reject down converting stage 212, an intermediate frequency (IF) trap 214, a first IF amplifier 216, an IF band pass filter (BPF) 218, and a second IF amplifier 220 having a controllable gain. In addition, the tunable receiver 220 comprises a synthesizer local oscillator (L.O.), a controller 224, a memory 226, and a control and data bus 228.

Figure 11:
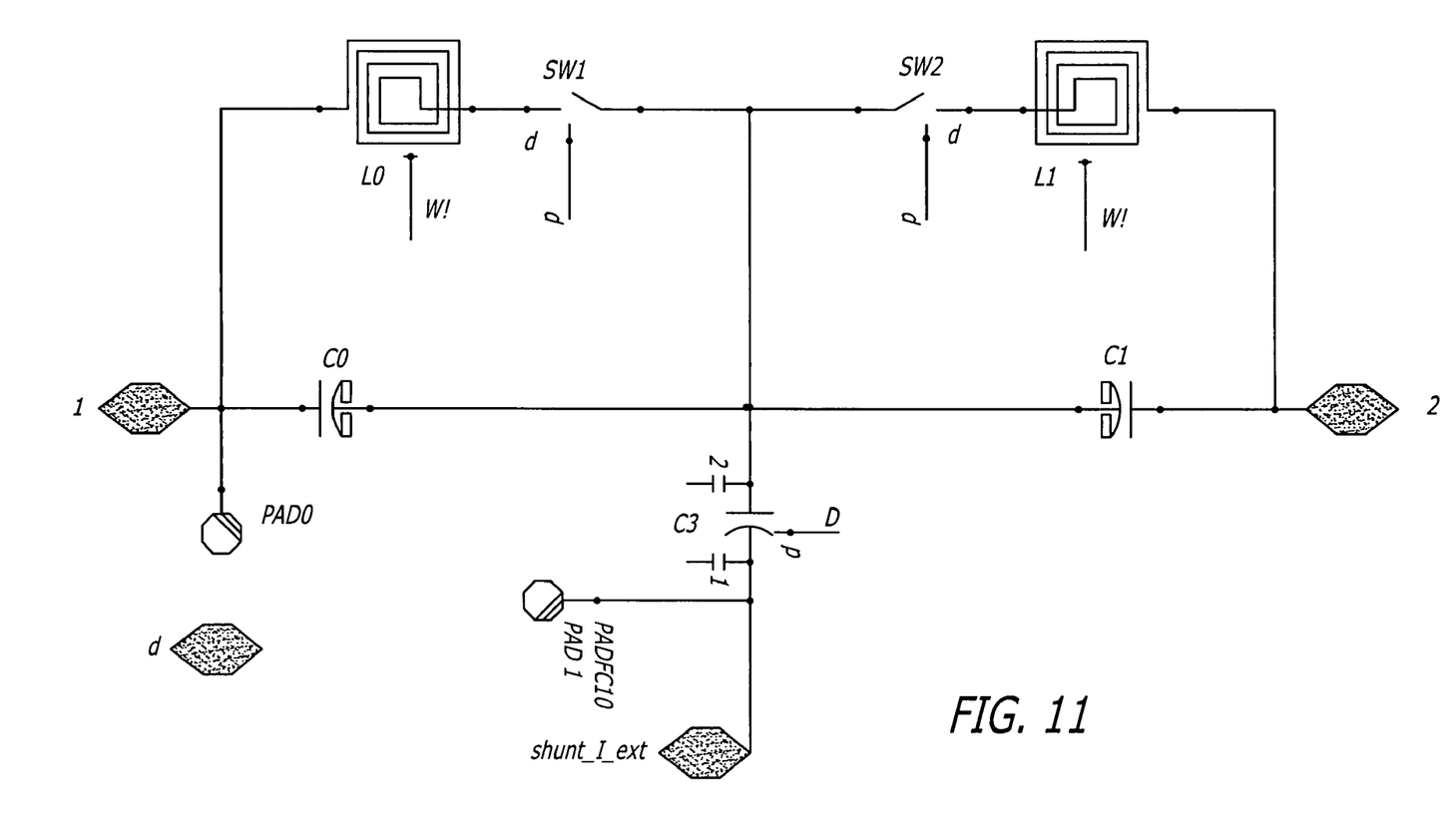
FIG. 11 is a circuit diagram for one embodiment of the preselect filter 202.

More specifically, details of an embodiment of the preselect filter 202 is shown in FIG. 11. The circuit includes two on-chip spiral inductors, L0 and L1, two fixed capacitors, C0 and C1, two MOSFET switches, SW1 and SW2, and a two-state (1-bit) digitally tunable capacitor. An external inductor to ground is connected to the pin labeled "shunt_1_ext". When control bit "d" is high, the circuit acts as a high pass filter and when it is brought low, it acts as a UHF band stop filter, or essentially a low pass filter.

A reason for the use of the preselect filter 202 is to improve the linearity and the unwanted signal rejection characteristics of the tunable receiver 200. Specifically, rejecting a particular band at this stage substantially lowers the power level of the received RF signal at the input of the first LNA 204, thereby improving the linearity of the LNA 204 and other downstream elements of the tunable receiver 200. The unwanted signal rejection characteristics of the tunable receiver 200 is dependent on the linearity of the receiver. Accordingly, by improving the linearity of the receiver 200 through the use of the preselect filter 202, the unwanted signal rejection characteristics of the tunable receiver 200 is also improved.

Downstream of the preselect filter 202 is the first LNA 204 which provides a first stage of signal amplification for the tunable receiver 200. The first LNA 204 and accompanying circuitry, namely the directional coupler 205, power monitor device 206, control and data bus 228, controller 224, and memory 226, are configured to maintain the first LNA 204 operating within a particular linearity specification. Specifically, the power monitor device 206, which is optional and may not always be included, may generate a parameter (e.g. a voltage) having a characteristic (e.g. an amplitude) related to the power level of the received RF signal at the output of the first LNA 204. If the controller 224 determines that the power monitor signal indicates that the power of the RF signal at the output of the first LNA 204 is at or above a pre-determined threshold, the controller 224 causes the gain of the first LNA 204 to reduce such that the power level is below the pre-determined threshold. Again, this feature improves the linearity of the tunable receiver 200, and consequently, improves the unwanted signal rejection characteristics of the tunable receiver 200.

Downstream of the first LNA 204 lies the bank of tracking filters 208 which are employed to provide rejection (i.e. suppression) of the image, harmonics, spurious, and other unwanted signals. More specifically, the bank of tracking filters 208 comprises first controllable switches 238, a plurality of tracking filters 240, 242, 244, and 246, and second controllable switches 250. The first controllable switches 2138 comprise an input coupled to the output of the first LNA 204, a plurality of outputs coupled respectively to the plurality of tracking filters 240, 242, 244, and 246, and a controllable input which receives control signals from the control and data bus 228 that controls the coupling between the switch input and any of the switch outputs. The second controllable switches 250 comprise a plurality of inputs coupled to the respective outputs of the tracking filters 240, 242, 244, and 246, an output coupled to the input of the second LNA 210, and a controllable input which receives control signals from the control and data bus 228 that controls the coupling between the switch output and any of the switch inputs.

The tracking filters 240, 242, 244, 246 are each configured to pass a distinct sub-band of channels, and substantially reject the remaining the undesired sub-bands of channels. For instance, tracking filter 240 may be configured to pass channels within a frequency sub-band extending from 50 to 150 MHz, tracking filter 242 may be configured to pass channels within a frequency sub-band extending from 150 to 350 MHz, tracking filter 244 may be configured to pass channels within a frequency sub-band extending from 350 to 650 MHz, and tracking filter 246 may be configured to pass channels within a frequency sub-band extending from 650 to 878 MHz. In addition, each of the tracking filters 240, 242, 244, and 246 may be digitally tunable to optimally pass a particular channel lying within the corresponding frequency sub-band, while rejecting the corresponding image signal, harmonics, spurious signals, and other unwanted signals. For example, the tracking filter 246 may be digitally tuned to optimally pass a 6 MHz width channel centered at 700 MHz, while substantially rejecting the image signals lying within the frequencies between 607 to 613 MHz and other undesired signals lying outside the intended channel of 697 to 703 MHz. In addition, by performing the undesired signal rejection, the tracking filter helps reduce the RF signal power for downstream elements to improve the linearity of the receiver 200. In some applications, more or fewer tracking filters may be used.

The controller 224, under the control of one or more software modules stored in the memory 226, may control the first and second controllable switches 238 and 250 by way of the control and data bus 228 to selectively couple the desired tracking filter in the path of the received RF signal. In addition, the controller 224, under the control of one or more software modules stored in the memory 226, may also digitally tune the selected tracking filter 242 by way of the control and data bus 228 to optimally pass the signals in the desired channel while rejecting the image signals, harmonics, spurious, and other unwanted signals lying outside of the desired channel. This will be discussed in more detail later with regard to a specific tracking filter implementation in accordance with the invention.

Downstream of the bank of tracking filters 208 lies another stage of signal amplification provided by the second LNA 210. The second LNA increases the power level of the received signal to compensate for losses incurred in the prior tracking filter stage. In addition, the second LNA 210 further converts the RF signal to a differential RF signal useful in the following down converting stage.

Downstream of the second LNA 210 lies the down converting stage 212 which converts the received RF signal to an intermediate frequency (IF) signal, while further rejecting the image, harmonics, spurious, and other unwanted signals residing outside of the desired channel. The down converting stage 212 comprises six (6) mixers each having a pair of inputs coupled to the differential outputs of the second LNA 210. The six (6) mixers also have inputs to respectively receive the different phases of the L.O. For instance, mixer 252 has an input to receive the L.O. signal cycling with a relative phase of zero (0) degree, mixer 254 has an input to receive the L.O. signal cycling with a relative phase of −45 degrees, mixers 256 and 258 have respective inputs to receive the L.O. signal cycling with a relative phase of −90 degrees, mixer 260 has an input to receive the L.O. signal cycling with a relative phase of −135 degrees, and mixer 262 has an input to receive the L.O. signal cycling with a relative phase of −180 degrees. The differential outputs of mixers 252, 254, and 256 are coupled together and applied to a 90 degree phase shifter 264 whose differential outputs, in turn, are coupled to a first input of a summing device 266. The differential outputs of mixers 258, 260, and 262 are coupled together and applied to the second input of the summing device 266. Alternatively, the 90 degree phase shifter 264 and the summing device 266 may be replaced with a polyphase filter.

In a typical conventional image rejection mixer, two mixers are used, both being driven by the local oscillator frequency, but at a 90 degree phase shift with respect to each other. The mixers both generate outputs of sum and difference frequency components which themselves are 90 out of phase with respect to each other. Then one of the mixer outputs is shifted 90 degrees and the two outputs are then combined (added together). Now, depending on selection of the location and direction of the 90 degree phase shifts, either the sum frequency components of the two mixer outputs add (are equal and inphase with each other) and the difference frequency components subtract (are equal and 180 degrees out of phase with each other), or the difference frequency components of the two mixer outputs add and the sum frequency components subtract, thereby passing the sum or difference frequencies, as desired, and eliminating (grossly attenuating) the difference or sum frequencies, respectively.

In a typical mixer, the signal is multiplied not by a sine wave, but rather multiplied by a square wave. This creates harmonics of the desired frequency band, with negative effects on linearity and range of subsequent circuitry. In the image rejection mixer of FIG. 2, four additional mixers are included, each operated at additional phase shifts as shown. The additional mixers have the effect of eliminating certain harmonics from the image rejection mixer output, avoiding problems caused by such harmonics.

Downstream of the down converting stage 212 lies the IF trap 214 which is provided to remove undesired signals generated by the down converting stage 212, to reduce the number of channels in the IF signal, and to reduce the power level of the IF signal to improve the linearity of downstream stages. The IF trap 214 is coupled across the differential signals at the output of the summing device 266. The IF trap 214 comprises a series resonant circuit coupled across the differential signal lines at the output of the summing device 266.

Downstream of the IF trap 214 lies a first stage of IF signal amplification provided by the IF amplifier 216 to compensate for signal losses incurred in the down converting stage 212, and losses that will be incurred in the following IF filter stage. The IF amplifier 216 comprises a pair of differential signal inputs coupled respectively to the differential signal outputs of the summing device 266. The IF amplifier 216 also comprises differential signal outputs.

Downstream of the first IF amplifier 216 lies the IF band pass filter (BPF) 218 which performs the channel select filtering for the tunable receiver 200. The IF BPF 218 is configured to perform high rejection of undesired signals lying outside of the selected channel.

Downstream of the IF BPF 218 lies a second stage of IF signal amplification provided by the second IF amplifier 220 to compensate for losses in the IF signal incurred in the filtering of the signal by the IF BPF 218. The IF amplifier 220 includes differential signal inputs coupled to the differential signal outputs of the IF BPF 218. The output IF signal of the selected channel is generated at the differential signal outputs of the IF amplifier 220. The IF amplifier 220 further comprises a gain control input coupled to the control and data bus 228 for controlling the gain of the IF amplifier 220. This allows the gain of the IF amplifier 220 to be controlled so that the power level of the output IF signal is regulated.

The synthesizer L.O. 222 generates the L.O. with the appropriate phases zero (0), −45, −90, −135, and −180 degrees for use by the down converting stage 212. The controller 224, under the control of one or more software modules stored in the memory 226 and an external controller, can control the synthesizer L.O. 222 by way of the control and data bus 228 to generate the appropriate frequency based on the selected channel. The controller 224 receives instructions from an external controller, and performs the intended operations under the control of one or more software modules stored in memory 226.

In operation, the controller 224 may receive an instruction from the external controller to tune the tunable receiver 200 to receive a particular channel. In response, the controller 224, under the control of one or more software modules stored in the memory 226, issues instructions to set the switches in the preselect filter 202 in the path of the received RF signal to select the desired band of channels. Also in response, the controller 224, under the control of one or more software modules stored in the memory 226, issues instructions to the switches 238 and 250 to couple the appropriate tracking filter 240, 242, 244 or 246 in the path of the received RF signal. In addition, the controller 224, under the control of the one or more software modules stored in the memory 226, digitally tunes the selected tracking filter to optimize the passing of the selected channel while substantially rejecting the image and other unwanted signals. Also in response to the channel-select command received from the external controller, the controller 224, under the control of one or more software modules stored in the memory 226, issues instructions to the synthesizer L.O. 222 to generate the L.O. signal with the appropriate frequency and phases for the selected channel.

In addition, the controller 224 may also receive commands from the external controller to adjust the gain of the first LNA 204 and the second IF amplifier 220. For instance, the output of the power monitor device 206 may be provided to the external controller either directly or by way of the controller 224 and control and data bus 228. If the output of the power monitor device 206 indicates that the power level of the RF signal at the output of the first LNA 204 is at or above a pre-determined threshold, the external controller may send a command to the controller 224 to lower the gain of the first LNA 204. In response, the controller 224, under the control of the one or more software modules stored in the memory 226, issues an instruction to the first LNA 204 by way of the control and data bus 228 to lower its gain so that the power level of the RF signal at the output of the first LNA 204 is below the pre-determined threshold.

Similarly, if the external controller deems that the power level of the IF output signal is not within specification, the external controller issues a command to the controller 224 to adjust the gain of the second IF amplifier 220. In response, the controller 224, under the control of one or more software modules stored in the memory 226, issues an instruction to the second IF amplifier 204 by way of the control and data bus 228 to adjust its gain such that the power level of the output IF signal is within specification.

II. The Tracking Filter Design

Figure 3:
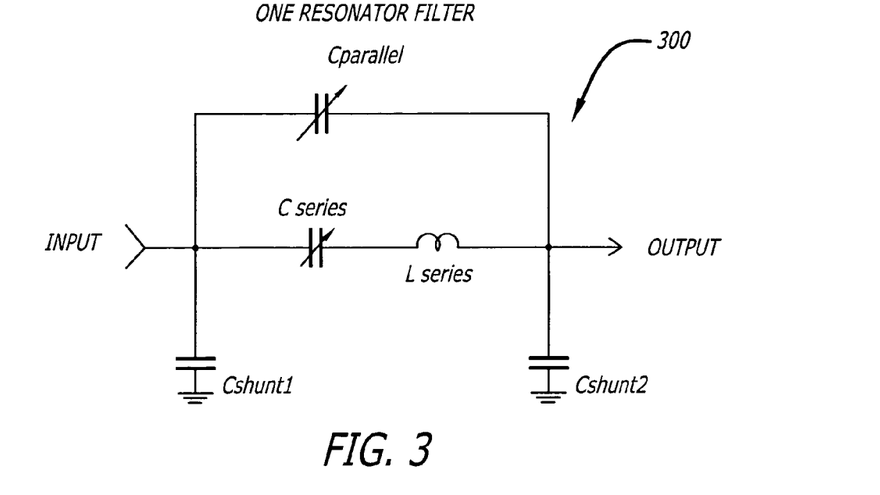
FIG. 3 illustrates a schematic diagram of an exemplary tracking filter in accordance with another embodiment of the invention.

FIG. 3 illustrates a schematic diagram of an exemplary tracking filter 300 in accordance with another embodiment of the invention. The tracking filter 300 is one example of a tracking filter that can be used as any one of the tracking filters 240, 242, 244, and 246 of the tunable receiver 200. The exemplary tracking filter 300 is a one resonator version of the filter. It comprises a capacitor Cseries connected in series with an inductor Lseries between input and output terminals of the filter 300. The tracking filter 300 further comprises a capacitor Cparallel connected in parallel with both the series capacitor Cseries and inductor Lseries. Additionally, the tracking filter 300 comprises a first shunt capacitor Cshunt1 connected between the input and a ground terminal and a second shunt capacitor Cshunt2 connected between the output and a ground terminal.

Both the series capacitor Cseries and the parallel capacitor Cparallel are variable, i.e. their capacitance can be selected. As will be discussed in more detail later, the series and parallel capacitors each use a switched capacitor array for setting the desired capacitance of the capacitors. The series capacitor Cseries is used to set the frequency response of the pass band, i.e. the selected channel. As customary, it is desirable to minimize the insertion loss and maximize the return loss of the tracking filter for the pass band. The parallel capacitor Cparallel sets the frequency response of the image band. As customary, it is desirable to maximize the insertion loss of the tracking filter for the image band.

Figure 4:
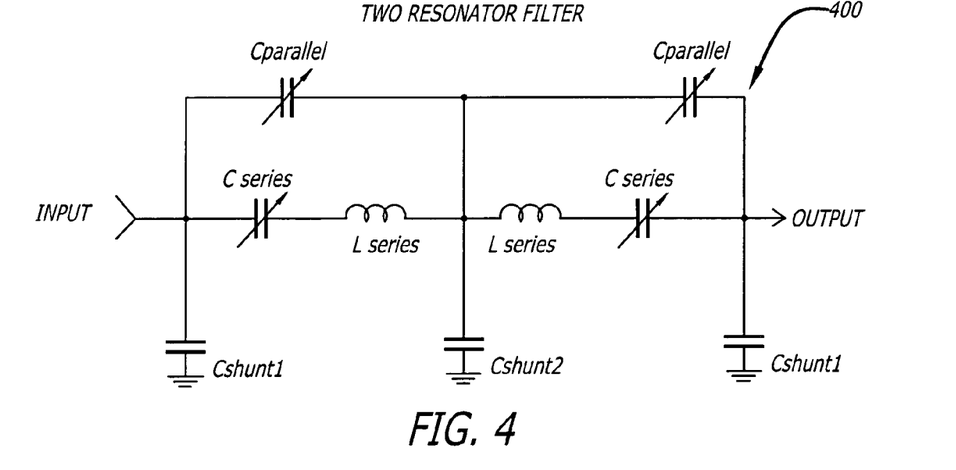
FIG. 4 illustrates a schematic diagram of an exemplary tracking filter in accordance with another embodiment of the invention.

FIG. 4 illustrates a schematic diagram of an exemplary tracking filter 400 in accordance with another embodiment of the invention. The tracking filter 400 is similar to track filter 300, except that filter 400 includes an additional resonator being the mirror image of the first resonator and having Cshunt2 in common. More specifically, the tracking filter 400 comprises a first series capacitor Cseries connected in series with a first series inductor Lseries between the input and an intermediate node. The tracking filter 400 further comprises a first parallel capacitor Cparallel connected between the input and the intermediate node, i.e. in parallel with the first series capacitor Cseries and first series inductor Lseries.

In addition, the tracking filter 400 further comprises a second series inductor Lseries connected in series with a second series capacitor Cseries between the intermediate node and the output. Also, the tracking filter 400 comprises a second parallel capacitor Cparallel connected between the intermediate node and the output, i.e. in parallel with the second series capacitor Cseries and the second series inductor Lseries. Further, the tracking filter 400 comprises an input shunt capacitor Cshunt1 connected between the input and a ground terminal, an intermediate shunt capacitor Cshunt2 connected between the intermediate node and a ground terminal, and an output shunt capacitor Cshunt1 connected between the output and a ground terminal.

Similar to the tracking filter 300, the first and second series capacitors Cseries and the first and second parallel capacitors Cparallel are variable, i.e. their capacitance can be selected. As will be discussed in more detail later, the series and parallel capacitors each use a switched capacitor array for setting the desired capacitance of the capacitors. The first and second series capacitor Cseries is used to set the frequency response of the pass band, i.e. the selected channel. As customary, it is desirable to minimize the insertion loss and maximize the return loss of the tracking filter for the pass band. The parallel capacitor Cparallel sets the frequency response of the image band. As customary, it is desirable to maximize the insertion loss of the tracking filter for the image band.

Figure 5:
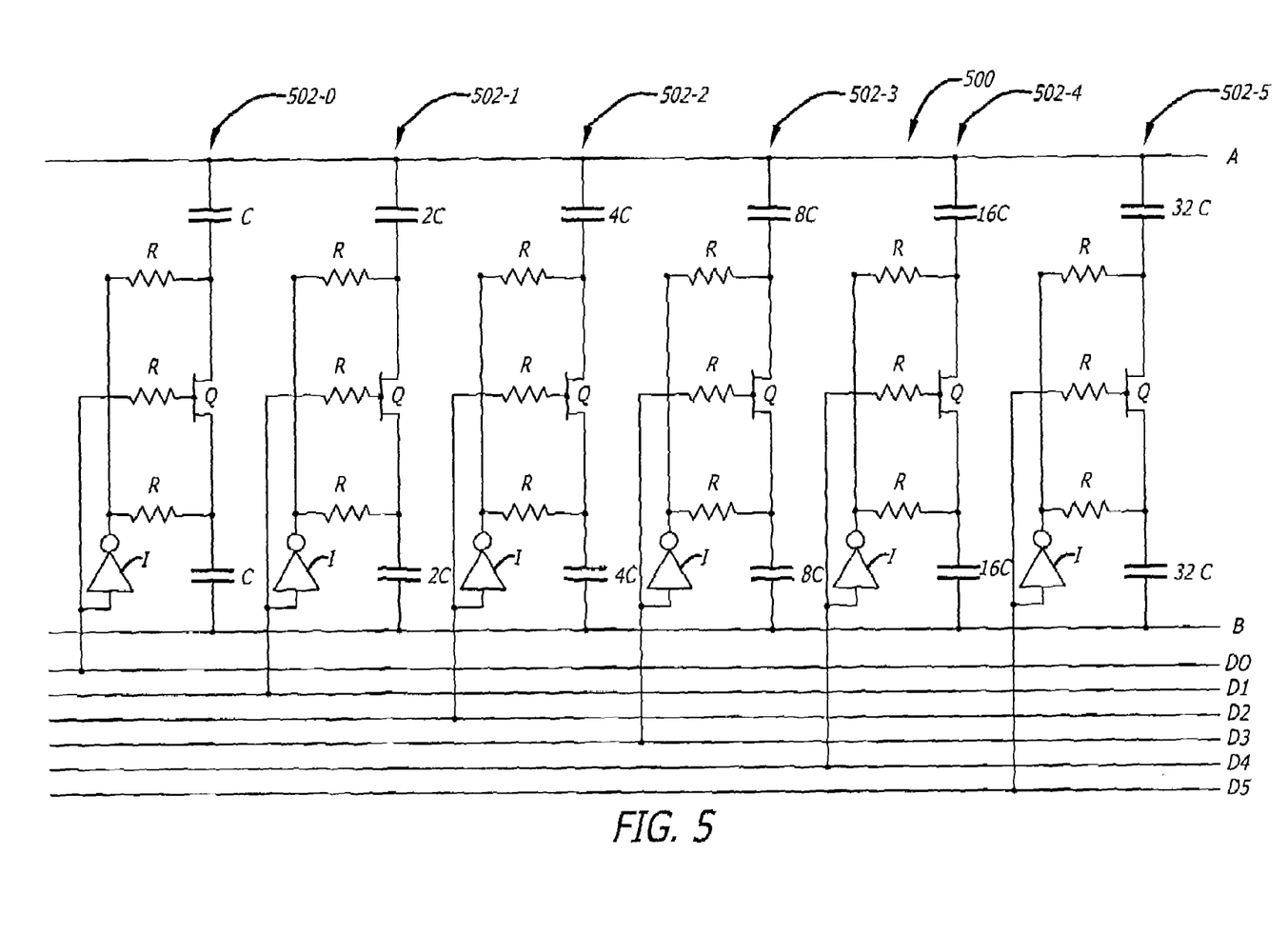
FIG. 5 illustrates a schematic diagram of an exemplary switched capacitor array (CSA) in accordance with another embodiment of the invention.

FIG. 5 illustrates a schematic diagram of an exemplary switched capacitor array (CSA) 500 in accordance with another embodiment of the invention. As discussed above, the CSA 500 can be used as the series and parallel capacitors of the tracking filters 300 and 400. The exemplary switched capacitor array 500 is a six (6) bit binary weighted CSA. Accordingly, the CSA 500 comprises six (6) selectable capacitor banks 502-0 through 502-5 coupled in parallel to each other and across common nodes A and B. The selectable capacitor banks 502-0 through 502-5 are respectively selectable by way of select lines D0-5.

Each of the capacitor banks comprises a series path extending from node A to node B including a first capacitor, a switching device such as field effect transistor (FET) Q, and a second capacitor. For instance, the series path of capacitor bank 502-0 comprises first capacitor C, the channel of FET Q, and second capacitor C; the series path of capacitor bank 502-1 comprises first capacitor 2C, the channel of FET Q, and second capacitor 2C; the series path of capacitor bank 502-2 comprises first capacitor 4C, the channel of FET Q, and second capacitor 4C; the series path of capacitor bank 502-3 comprises first capacitor 8C, the channel of FET Q, and second capacitor 8C; the series path of capacitor bank 502-4 comprises first capacitor 16C, the channel of FET Q, and second capacitor 16C; and the series path of capacitor bank 502-5 comprises first capacitor 32C, the channel of FET Q, and second capacitor 32C.

The gates of the FETs of the capacitor banks 502-0 through 502-5 are respectively coupled to the select lines D0-5 by way of resistors R. The sources and the drains of the FETs of the capacitor banks 502-0 and 502-5 are respectively coupled to the select lines D0-5 by way of resistors R and inverters I.

In operation, when a desired capacitor bank is to be selected, the signal on the corresponding select line is driven to a logic high state (e.g. +3 Volts). Accordingly, the voltage on the gate of the FET is also approximately at the logic high level. The corresponding inverter I generates a logic low state (e.g. 0 Volt) in response to the corresponding select line being driven to a logic high state. This results in a logic low voltage (e.g. 0 Volt) present on the drain and source of the corresponding FET. The low logic voltage (e.g. 0 Volt) on the drain and source of the FET and the high logic voltage (e.g. +3 Volts) on the gate of the FET places the FET in a low impedance mode, thereby electrically connecting the first and second capacitors in series between nodes A and B, and thus enabling the corresponding capacitor bank.

When a desired capacitor bank is to be deselected, the signal on the corresponding select line is driven to a logic low state (e.g. +0 Volt). Accordingly, the voltage on the gate of the FET is also approximately at the logic low level. The corresponding inverter I generates a logic high state (e.g. +3 Volts) in response to the corresponding select line being driven to a logic low state. This results in a logic high voltage (e.g. +3 Volts) present on the drain and source of the corresponding FET. The high logic voltage (e.g. +3 Volts) on the drain and source of the FET and the low logic voltage (e.g. 0 Volt) on the gate of the FET places the FET in a high impedance and low capacitance, thereby electrically isolating the first and second capacitors in series between nodes A and B, and thus disabling the corresponding capacitor bank.

The capacitor banks 502-0 through 502-5 of the exemplary CSA 500 provide a selectable binary weighted capacitance. For instance, capacitor bank 502-0 when selected provides an effective capacitance of approximately ½ C between nodes A and B, capacitor bank 502-1 when selected provides an effective capacitance of approximately C between nodes A and B, capacitor bank 502-2 when selected provides an effective capacitance of approximately 2C between nodes A and B, capacitor bank 502-3 when selected provides an effective capacitance of approximately 4C between nodes A and B, capacitor bank 502-4 when selected provides an effective capacitance of approximately 8C between nodes A and B, and capacitor bank 502-5 when selected provides an effective capacitance of 16C between nodes A and B. Thus, the overall capacitance provided by the CSA 500 depends on the unique combination of selected capacitor banks 502-0 and 502-5.

III. Method of Calibrating and Tuning the Tracking Filter

As discussed in Section I regarding the design of the tunable receiver 200, the tracking filter is employed to pass signals in the desired channel with minimal insertion loss, and to reject signals in the image band with maximum insertion loss. In addition, since a tracking filter covers a sub-band made up of a plurality of channels, the tracking filter is electronically tunable to minimize the insertion loss and maximize the return loss for the desired channel, and maximize the insertion loss for the image band. As discussed in Section II regarding the design of the tracking filter, the CSA are employed within a tracking filter to electronically adjust the capacitance of the series and parallel capacitors in order to achieve the desired frequency response for the selected channel band and for the image band. The following describes unique methods of calibrating and tuning a tracking filter in order to achieve these objectives.

Figure 6:
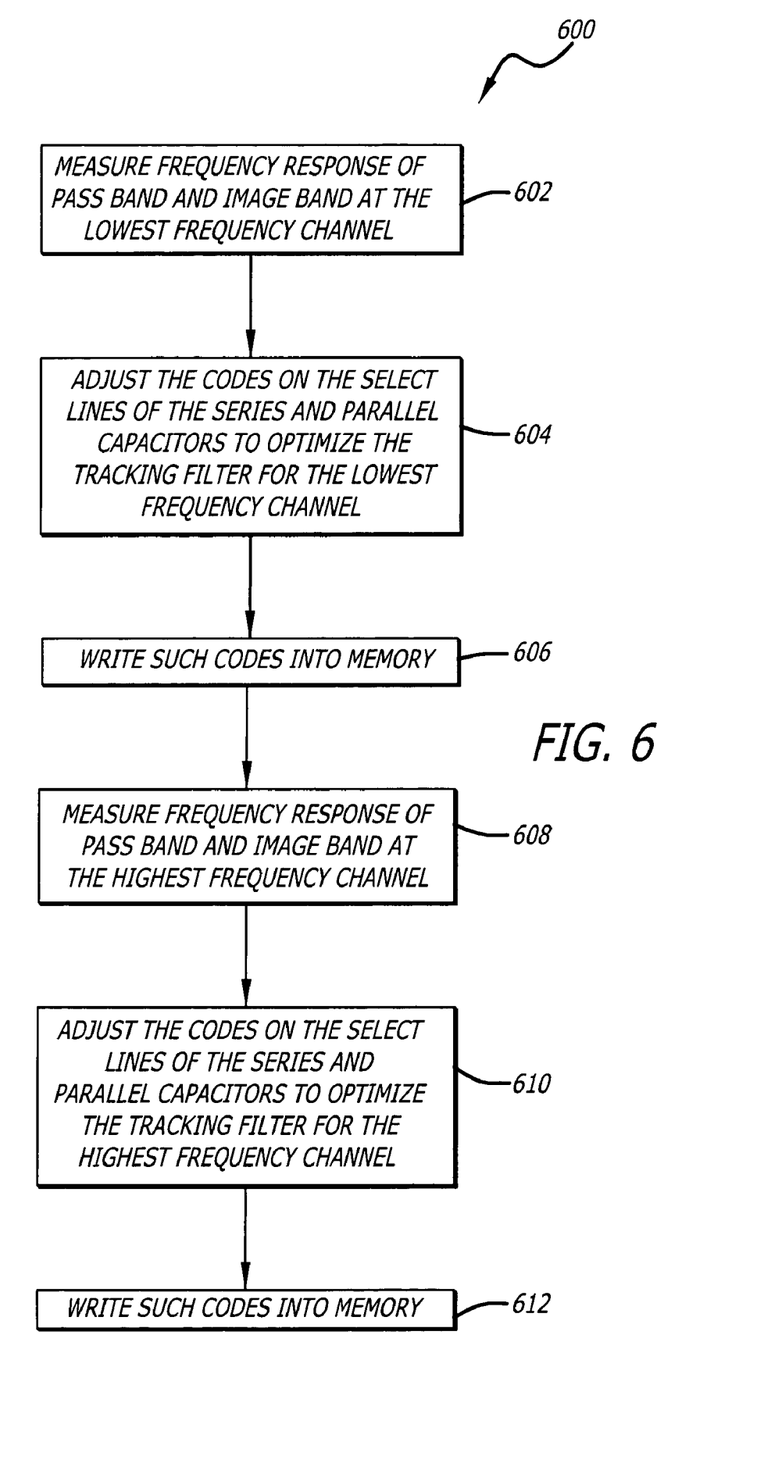
FIG. 6 illustrates a flow diagram of an exemplary method of calibrating a tracking filter in accordance with another embodiment of the invention.

FIG. 6 illustrates a flow diagram of an exemplary method 600 of calibrating a tracking filter in accordance with another embodiment of the invention. According to the method 600, a measurement is taken of the frequency response of the pass and image bands of the tracking filter at the lowest frequency channel of the corresponding sub-band (block 602). Then, the codes on the select lines corresponding to the parallel and series capacitors of the tracking filters are adjusted to optimize the filter to provide the desired specification for the pass and image bands of the tracking filter (block 604). For example, such codes may be respectively a binary 27 and a binary 63 for a lowest frequency channel centered at 570 MHz (See FIG. 10). In a preferred embodiment, a nominal or most probable code is determined, and the difference between the optimal code and the nominal code for that IC is written into memory 226 of the tunable receiver 200 for use by the controller 224 in tuning the tracking filter (block 606).

After the codes corresponding to the lowest frequency channel have been determined, a measurement is taken of the frequency response of the pass and image bands of the tracking filter at the highest frequency channel of the corresponding sub-band (block 608). Then, the codes on the select lines corresponding to the parallel and series capacitors of the tracking filter are adjusted to optimize the filter to provide the desired specification for the pass and image bands of the tracking filter (block 610). For example, such codes may be respectively a binary 4 and a binary 1 for a highest frequency channel centered at 820 MHz (See FIG. 10). After such codes have been determined, in the preferred embodiment, the difference between the optimal code and the nominal code for that IC are written into memory 226 of the tunable receiver 200 for use by the controller 224 in tuning the tracking filter (block 612).

Figure 7:
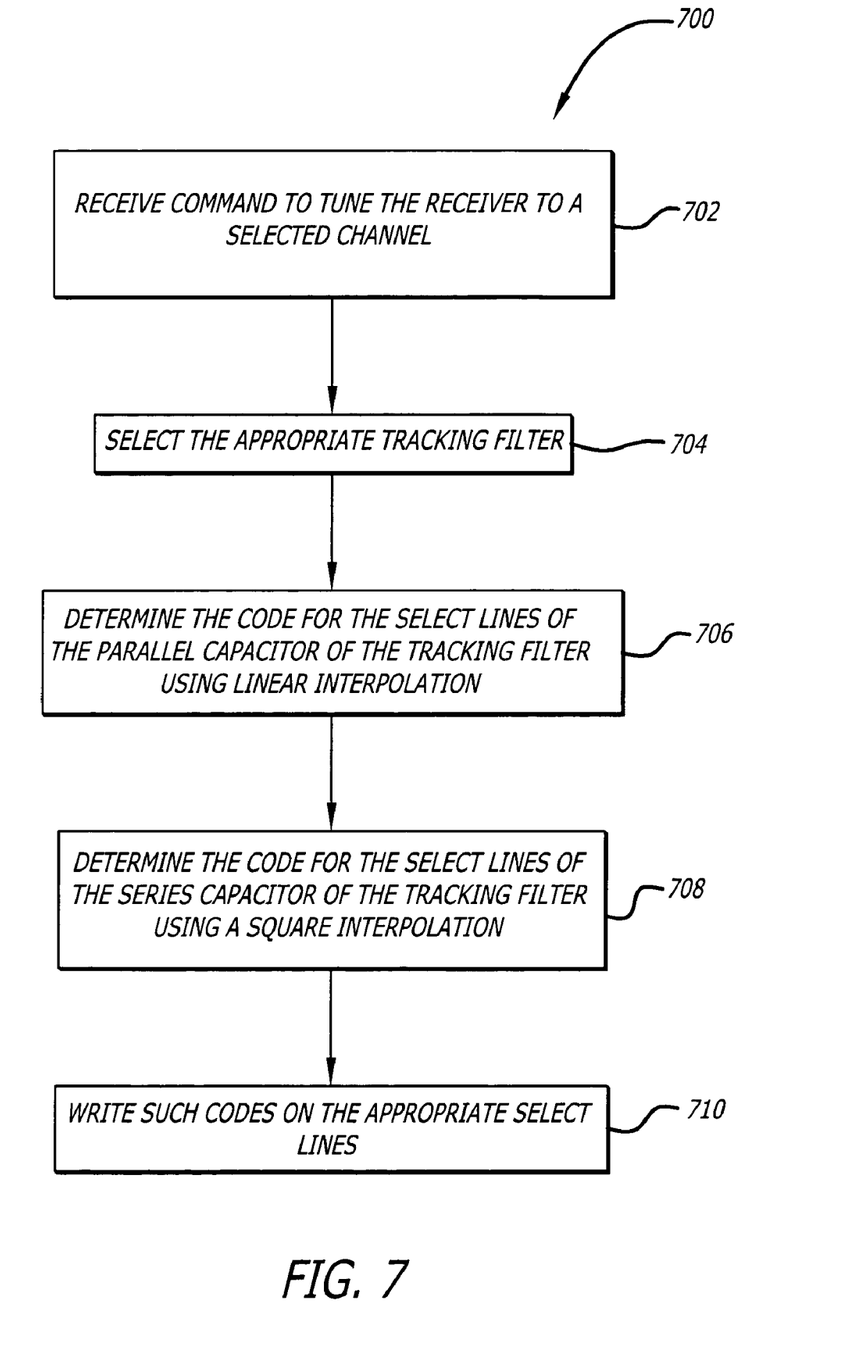
FIG. 7 illustrates a flow diagram of an exemplary method of tuning a tracking filter in accordance with another embodiment of the invention.

FIG. 7 illustrates a flow diagram of an exemplary method 700 of tuning a tracking filter in accordance with another embodiment of the invention. According to the method 700, the controller 224 receives a command from an external controller to tune the receiver to a selected channel (block 702). The controller 224 then determines which tracking filter 240, 242, 244, or 246 covers the selected channel and instructs the switches 238 and 250 to couple the selected tracking filter in the path of the received RF signal (block 704). Then, the controller 224 performs an appropriate (possibly nonlinear) interpolation to determine the code for the parallel capacitor of the corresponding tracking filter (block 706).

Then, the controller 224 performs another predetermined nonlinear interpolation to determine the code for the series capacitor of the corresponding tracking filter (block 708). After the controller 224 determines the codes for the parallel and series capacitors, the controller 224 sends the codes to the corresponding tracking filter by way of the control and data bus 228 (block 710).

Figure 8:
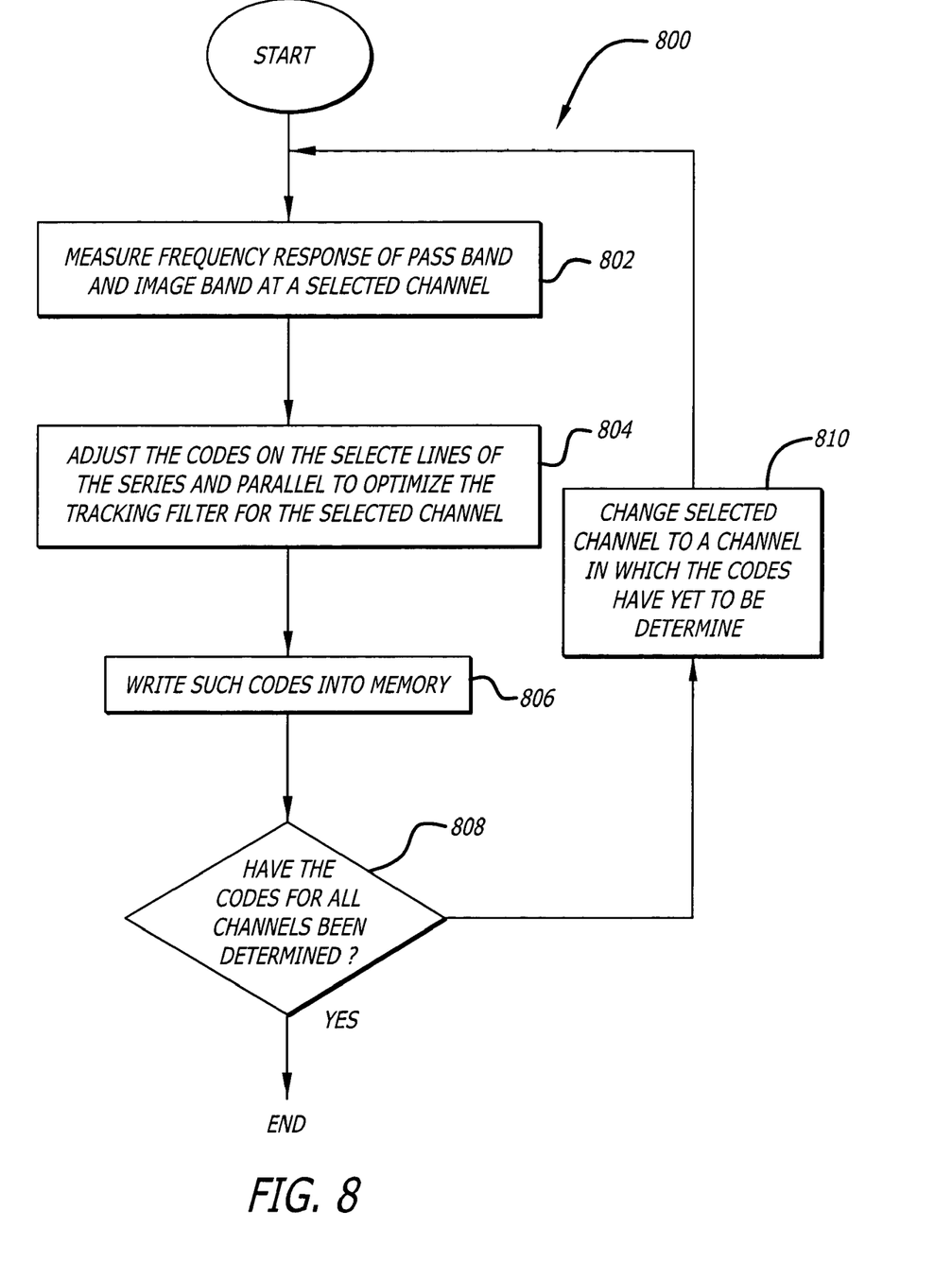
FIG. 8 illustrates a flow diagram of an exemplary method of calibrating a tracking filter in accordance with another embodiment of the invention.

FIG. 8 illustrates a flow diagram of an exemplary method 800 of calibrating a tracking filter in accordance with another embodiment of the invention. According to the method 800, a measurement of the frequency response of the pass band and image band of the tracking filter is taken at a selected channel (block 802). Then, the codes on the select lines for the series and parallel capacitors are adjusted to achieve a desired frequency response for the pass band and image band of the tracking filter for the selected channel (block 804). The codes are then written into the memory 226 in a look-up table structure or the like for use by the controller 224 in tuning the corresponding tracking filter (block 806). At this point, it is determined whether the codes for all the channels covered by the corresponding tracking filter have been determined (block 808). If they have not, then the selected channel is changed to a channel in which the codes have yet to be determined (block 810), and the method 800 proceeds back to block 802. Otherwise, the method 800 of calibrating the tracking filter is complete.

Figure 9:
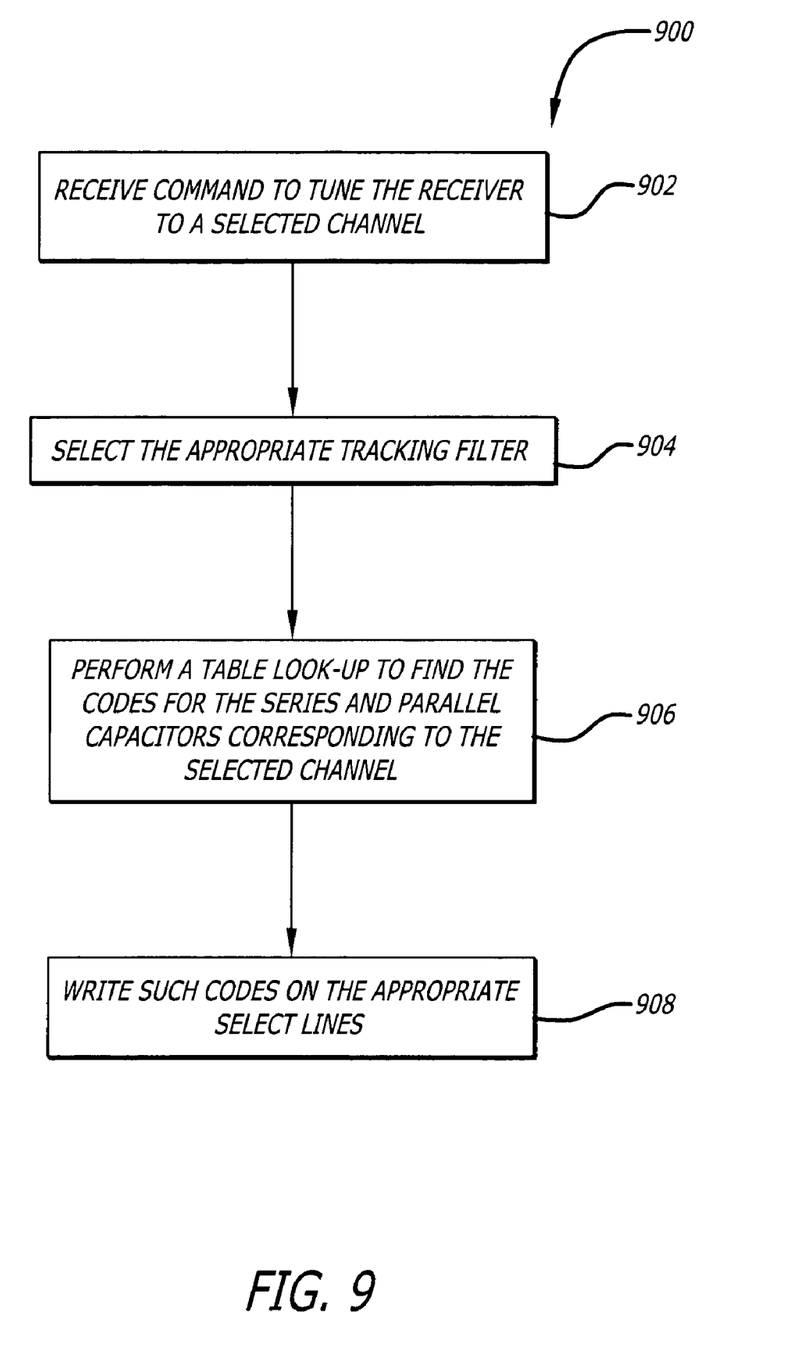
FIG. 9 illustrates a flow diagram of an exemplary method of tuning a tracking filter in accordance with another embodiment of the invention.
Figure 10:
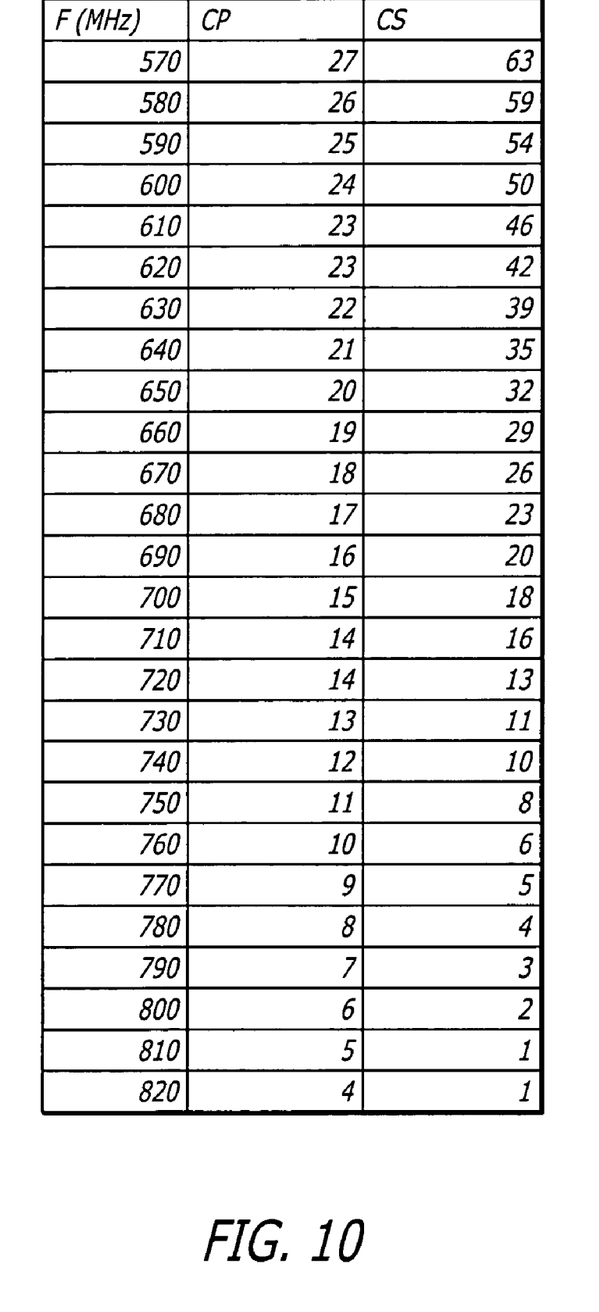
FIG. 10 illustrates a table depicting exemplary binary codes for the parallel and series capacitors of a tracking filter corresponding to selected channels covered by the tracking filter.

FIG. 9 illustrates a flow diagram of an exemplary method of tuning a tracking filter in accordance with another embodiment of the invention. According to the method 900, the controller 224 receives a command from an external controller to tune the receiver to a selected channel (block 902). The controller 224 then determines which tracking filter 240, 242, 244, or 246 covers the selected channel and instructs the switches 238 and 250 to couple that tracking filter in the path of the received RF signal (block 904). Then, the controller 224 performs a look-up in a table-like data structure (see FIG. 10) stored in the memory 226 and reads the corresponding codes for the parallel and series capacitors (block 906). Referring to FIG. 10, if, for example, the selected channel is centered at 760 MHz, the controller 224 merely reads the binary codes associated with that channel, such as binary code 10 for the parallel capacitor and binary code 6 for the series capacitor. After the codes have been read, the controller 224 sends them to the tracking filter by way of the control and data bus 228 (block 908).

Figure 12:
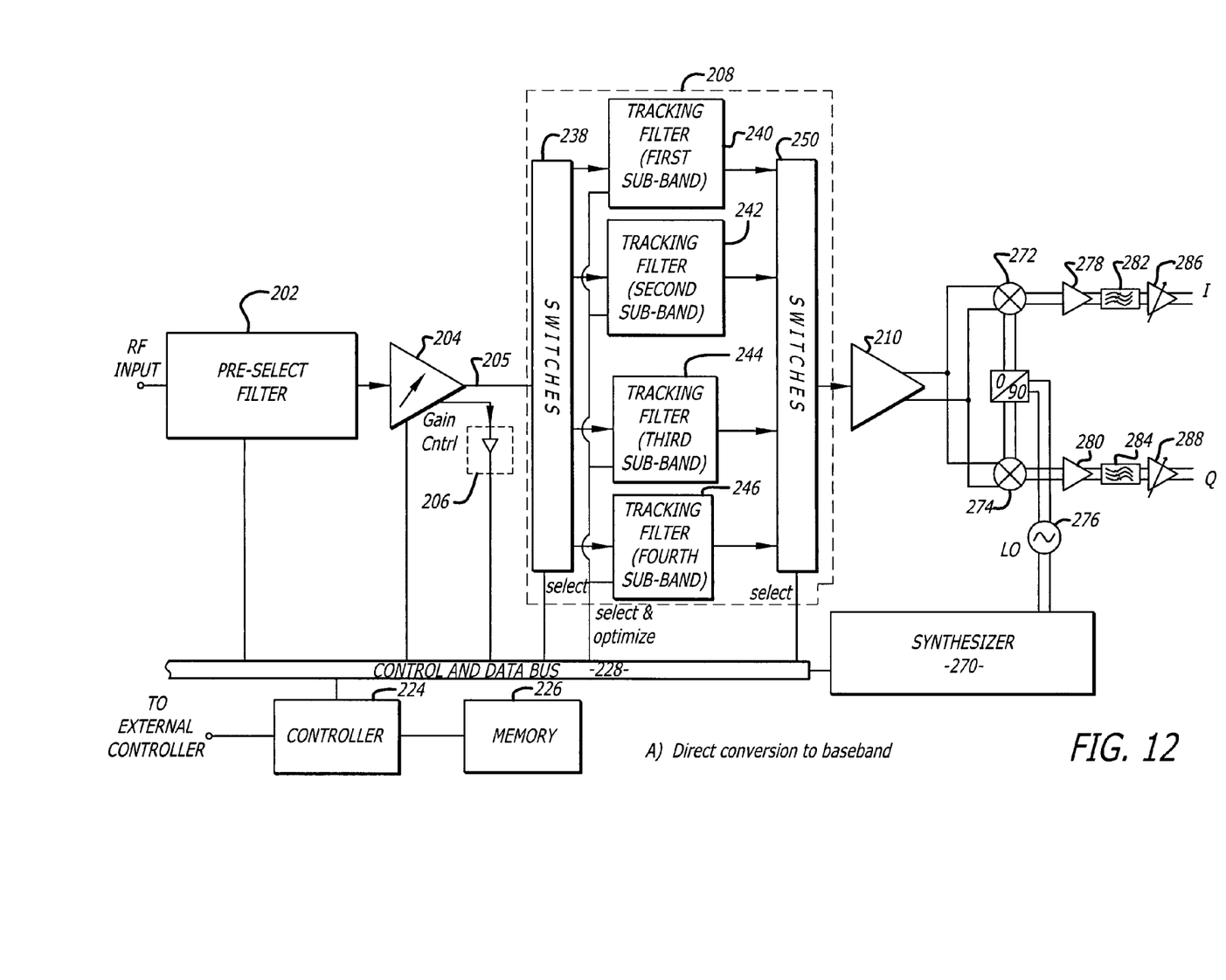
FIG. 12 illustrates a block diagram of an exemplary tunable receiver in accordance with an embodiment of the invention having a baseband output; and, FIG. 13 illustrates a block diagram of an exemplary tunable receiver in accordance with an embodiment of the invention having a baseband digital output.

Now referring to FIG. 12, an alternate embodiment of the present invention may be seen. This embodiment may be substantially identical to the embodiment of FIG. 2 with the exception that the output of the low noise amplifier 210 is converted directly to baseband. Because of the conversion to baseband, there are no image frequencies to worry about and accordingly, a simple I-Q demodulator or converter may be used. The references for mixers 272 and 274 are provided by local oscillator 276 driven by synthesizer 270 controlled through the bus 228, the two mixers 272 and 274 being driven by the local oscillator 90 degrees out of phase with each other to provide the in-phase and quadrature outputs. These outputs in turn are amplified by amplifiers 278 and 280 and filtered by low pass filters 282 and 284 to provide the I and Q outputs through variable gain amplifiers 286 and 288. Alternatively, the mixers 272 and 274 may be harmonic rejection mixers of the general type illustrated wit respect to the embodiment of FIG. 2.

Figure 13:
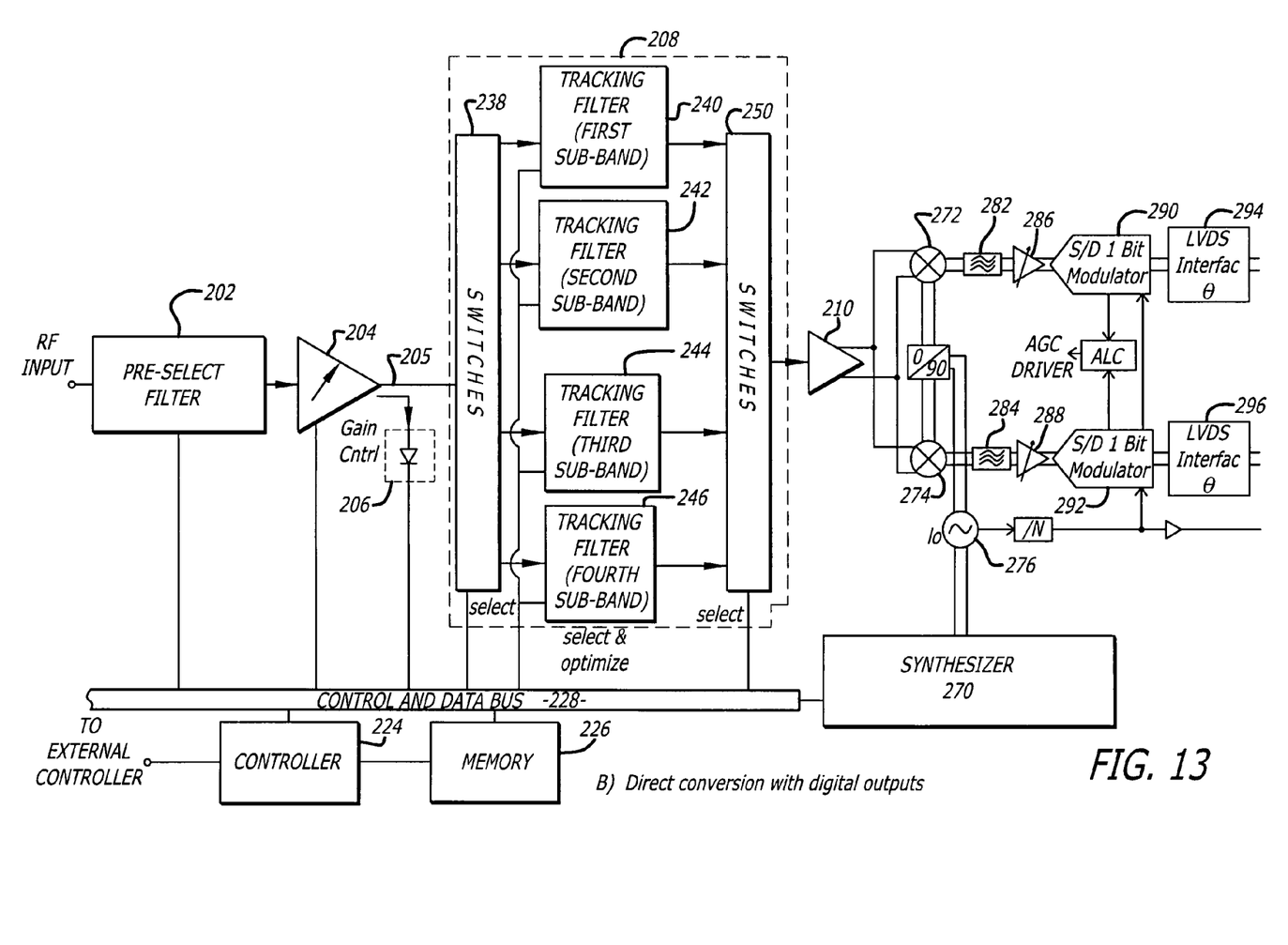

A still further embodiment is shown in FIG. 13. This embodiment is very similar to the embodiment of FIG. 12, though with the baseband signals being provided as digital outputs. Thus, in this embodiment, the outputs of variable gain amplifiers 286 and 288 are provided to one-bit sigma-delta converters or modulators 290 and 292 and each converted to a low voltage differential signal by the LVDS interfaces 294 and 296. In this embodiment, the sigma-delta modulators provide an automatic gain control signal for the variable gain amplifiers 286 and 288. The local oscillator 296 also provides a timing reference for the low voltage digital signal outputs. Alternatively, other analog to digital conversion technologies may be used, such as, by way of example, pipelined analog to digital converters, in place of the sigma-delta converters 290 and 292.

The degree of integration used for the present invention may vary, as desired. By way of example, the entire receiver may be on a single integrated circuit. However, various components may be in discrete form and the rest of the circuit in integrated circuit form. For instance, one or more of the inductances, including possibly all of the inductors, may be in discrete form off-chip, realized, by way of example, as surface mount devices or as printed inductors, such as on a printed circuit board. In one embodiment, one inductor of the preselect filter is realized as a printed inductor on the LGA (land grid array) package, with the other two inductors and the rest of the receiver realized on-chip, so that the entire receiver is provided in a single plastic package. In another embodiment, the tracking filters, the mixer, the first plurality of switches the second plurality of switches, the controller and the memory are on a single integrated circuit. Many other variations may be used as desired.

In the foregoing specification, the invention has been described with reference to specific embodiments thereof. It will be evident however, that various modifications and changes may be made thereto without departing from the broader spirit and scope of the invention. The specification and drawings are, accordingly, to be regarded in an illustrative rather than a restrictive sense.

The invention claimed is:

1. In a tunable receiver, the improvement comprising:
    a plurality of tracking filters, each tracking filter having an input and an output, each tracking filter having a center frequency that is digitally tunable over a respective frequency range;
    a mixer;

a first plurality of switches, each coupled to the input of a respective tracking filter to couple an RF signal to a selected one of the tracking filters;

a second plurality of switches, each coupled to the output of a respective tracking filter, to couple an RF signal from the selected one of the tracking filters to the mixer to convert the RF frequency to a predetermined frequency.

2. The improvement of claim 1 wherein the predetermined frequency is an IF frequency.

3. The improvement of claim 1 wherein the predetermined frequency is a baseband frequency.

4. The improvement of claim 1 further comprising a controller coupled to the first and second plurality of switches and to the plurality of tracking filters, the controller being responsive to control instructions to select and tune any one of the tracking filters in accordance with a respective control instruction.

5. The improvement of claim 4 wherein each tracking filter comprises a plurality of tuning elements, each switchable into or out of a tracking filter circuit, the controller also being coupled to control the switching of tuning elements into or out of each respective tracking filter circuit, the controller tuning each respective tracking filter by switching tuning elements into or out of the respective tracking filter circuit responsive to respective control instructions.

6. The improvement of claim 5 further comprising a memory storing predetermined tracking filter calibration information, the controller being responsive to respective control instructions to control the switching of tuning elements into and out of the respective tracking filter circuit in accordance with the predetermined tracking filter calibration information.

7. The improvement of claim 6 wherein the plurality of tracking filters, the mixer, the first plurality of switches, the second plurality of switches and the memory are on a single integrated circuit.

8. The improvement of claim 6 wherein the tracking filters are inductance-capacitance tracking filters, and wherein the tuning elements are capacitances.

9. The improvement of claim 8 wherein values of the capacitances are in a binary progression.

10. The improvement of claim 9 wherein the tracking filters, the mixer, the first plurality of switches, the second plurality of switches and the memory are on a single integrated circuit.

11. The improvement of claim 9 wherein the inductances are discrete components and the rest of the tracking filters, the mixer, the first plurality of switches, the second plurality of switches and the memory are on a single integrated circuit.

12. The improvement of claim 1 wherein the tracking filters are filters configured to pass frequencies of a selected channel and suppress image frequencies of the selected channel.

13. The improvement of claim 12 wherein the mixer is an image rejection mixer.

14. The improvement of claim 13 wherein the image rejection mixer is configured to also suppress undesired conversion of signals by harmonics of a local oscillator.

15. The improvement of claim 1 wherein the predetermined frequency is a baseband frequency, and the tracking filters are band pass filters for passing frequencies of a selected channel and suppressing frequencies outside the selected channel.

16. The improvement of claim 15 wherein the mixer is configured to suppress predetermined harmonics.

17. The improvement of claim 1 wherein the mixer is an image rejection mixer, and further comprised of a local oscillator coupled to the controller, the controller controlling the frequency of the local oscillator responsive to the control instructions to provide the predetermined IF output of the image rejection mixer independent of the tuning of the tracking filters.

18. The improvement of claim 17 further comprising a memory storing predetermined tracking filter calibration information, the controller being responsive to respective control instructions to control the switching of tuning elements into or out of the respective tracking filter circuit in accordance with the predetermined tracking filter calibration information.

19. The improvement of claim 18 wherein the tracking filters are inductance-capacitance filters and wherein the tracking filters other than the inductances, the image rejection mixer, the first plurality of switches, the second plurality of switches, the controller, the local oscillator and the memory are on a single integrated circuit.

20. The improvement of claim 19 wherein at least one of the inductances is on the single integrated circuit.

21. The improvement of claim 19 wherein at least one of the, inductances is a printed inductance on a printed circuit board.

22. A television receiver comprising:

a preselect filter, the preselect filter being tunable to pass VHF frequencies and suppress UHF frequencies, or to pass UHF frequencies and suppress VHF frequencies;

first and second pluralities of switches;

a plurality of tracking filters, each tracking filter having an input and an output, each tracking filter having a center frequency that is digitally tunable over a respective frequency range for passing a selected television channel and suppressing the television channel image frequencies;

an image rejection mixer;

a local oscillator coupled to the mixer; and, a controller;

the first plurality of switches each being coupled to the input of a respective tracking filter;

the second plurality of switches each being coupled to an output of a respective tracking filter to controllably couple an output of one of the tracking filters to the mixer;

the controller being coupled to the preselect filter and the first and second pluralities of switches, the plurality of tracking filters and the local oscillator and responsive to channel selection control instructions to tune a respective tracking filter, to pass a television RF signal through a respective preselect filter, the respective tracking filter, and the mixer to shift the RF frequency of the channel selection to a predetermined IF frequency.

23. The receiver of claim 22 wherein the receiver is on a single integrated circuit.

24. The receiver of claim 22 wherein the tracking filters comprise inductance-capacitance filters with one or more discrete inductances, and wherein the rest of the receiver is on a single integrated circuit.

25. The receiver of claim 22 wherein the outputs of the preselect filter are coupled to the input of the first plurality of switches through an amplifier, and the outputs of the second plurality of switches are coupled to the image rejection mixer through a second amplifier.

26. The receiver of claim 22 wherein each tracking filter comprises inductance-capacitance filters having a plurality of selectable capacitances and tunable by coupling one or more of the capacitances into the tracking filter, the receiver being further comprised of a memory storing predetermined calibration information for the tracking filters, the controller tuning respective tracking filters responsive to the channel selection control signal using the predetermined calibration information.

27. The receiver of claim 26 wherein the receiver is on a single integrated circuit.

28. The receiver of claim 27 wherein the capacitances associated with each tracking filter have capacitance values in a binary progression.

29. The receiver of claim 26 wherein the tracking filters comprise one or more discrete inductances, and wherein the rest of the receiver is on a single integrated circuit.

30. The receiver of claim 29 wherein the capacitances associated with each tracking filter have capacitance values in a binary progression.

31. A method of operating a television receiver comprising:
providing channel select control instructions to an integrated circuit, and in response to the control instructions and on the integrated circuit;
digitally tuning a respective tracking filter in accordance with the channel selected by the channel select control instructions;
setting the frequency of a local oscillator coupled to a mixer to shift an RF frequency corresponding to the channel selected to a predetermined intermediate frequency;
directing a television RF signal to the respective tracking filter; and,
mixing the output of the respective tracking filter with the frequency of the local oscillator to shift the RF frequency of the selected channel to the intermediate frequency.

32. The method of claim 31 wherein the respective tracking filter is tuned to suppress image frequencies for the channel selected.

33. The method of claim 32 wherein the output of the respective tracking filter is mixed with the frequency of the local oscillator using an image rejection mixer.

34. The method of claim 33 wherein the image rejection mixer is configured to suppress certain harmonics.

35. The method of claim 33 wherein the respective tracking filter is tuned by switching one or more capacitors into a tracking filter circuit.

36. The method of claim 35 wherein the capacitors have capacitances in a binary progression.

37. The method of claim 35 wherein the respective tracking filter is tuned in response to channel select instructions in accordance with predetermined tracking filter calibration data stored on the integrated circuit.

38. The method of claim 31 further comprised of filtering the television RF signal to suppress UHF or VHF frequencies responsive to channel select instructions before directing the television RF signal to the respective tracking filter.

39. The method of claim 35 wherein the tracking filters are inductance-capacitance filters using one or more discrete inductors not on the integrated circuit.

40. The method of claim 35 wherein the tracking filters are inductance-capacitance filters on the integrated circuit.

41. A method of operating a television receiver comprising:
providing channel select control instructions to an integrated circuit, and in response to the control instructions and on the integrated circuit;
digitally tuning a respective tracking filter to pass the frequencies of the channel selected and to suppress image frequencies by switching one or more capacitors into a respective tracking filter circuit;
setting the frequency of a local oscillator coupled to a mixer to shift an RF frequency corresponding to the channel selected to a predetermined intermediate frequency;
filtering a television RF signal to suppress UHF or VHF frequencies dependent on whether the channel selected is a VHF or a UHF frequency channel, respectively;
directing the filtered television RF signal to the respective tracking filter; and,
mixing the output of the respective tracking filter with the frequency of the local oscillator to convert the RF frequency of the selected channel to the intermediate frequency and to suppress image frequencies.

42. The method of claim 41 wherein the mixing is performed by an image rejection mixer.

43. The method of claim 42 wherein the image rejection mixer is configured to suppress certain harmonics.

44. The method of claim 41 wherein the capacitors have capacitances in a binary progression.

45. The method of claim 41 wherein the respective tracking filter is tuned in response to channel select instructions in accordance with predetermined tracking filter calibration data stored on the integrated circuit.

46. The method of claim 41 wherein the tracking filters are inductance-capacitance filters using one or more discrete inductors not on the integrated circuit.

47. The method of claim 41 wherein the tracking filters are inductance-capacitance filters on the integrated circuit.

* * * * *